(12) United States Patent
Crisp et al.

(10) Patent No.: US 12,207,432 B2
(45) Date of Patent: Jan. 21, 2025

(54) AGGREGATE RAIL SYSTEM FOR A RACK ASSEMBLY

(71) Applicant: Dell Products L.P., Round Rock, TX (US)

(72) Inventors: Richard Andrew Crisp, Austin, TX (US); Kevin Warren Mundt, Austin, TX (US); Brad Philip Collins, Austin, TX (US); Peter Anschel Kaltenbach, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 54 days.

(21) Appl. No.: 18/063,742

(22) Filed: Dec. 9, 2022

(65) Prior Publication Data

US 2024/0196557 A1     Jun. 13, 2024

(51) Int. Cl.
*H05K 7/14*     (2006.01)
*H02G 5/04*     (2006.01)

(52) U.S. Cl.
CPC ............ *H05K 7/1492* (2013.01); *H02G 5/04* (2013.01)

(58) Field of Classification Search
CPC ................................ H05K 7/1492; H02G 5/04
See application file for complete search history.

(56) References Cited

U.S. PATENT DOCUMENTS

| | | | | |
|---|---|---|---|---|
| 6,769,551 B2* | 8/2004 | Rafferty | ............... | H05K 7/1492 211/192 |
| 9,231,358 B1* | 1/2016 | Schow | ............... | H01R 13/6335 |
| 9,585,288 B2* | 2/2017 | Powers | ............... | H05K 7/20572 |
| 9,772,663 B2* | 9/2017 | Thul | ........................ | G06F 1/189 |
| 10,499,531 B2* | 12/2019 | Schmidt | ............... | H05K 7/1498 |
| 10,932,388 B1* | 2/2021 | Davis | ....................... | G06F 1/188 |
| 11,177,599 B2* | 11/2021 | Horning | ................. | H01R 13/14 |
| 11,355,902 B2* | 6/2022 | Corban | ................ | H01R 13/187 |
| 2009/0034181 A1* | 2/2009 | Gizycki | ............... | H01R 13/652 361/822 |

\* cited by examiner

*Primary Examiner* — Anthony Q Edwards
*Assistant Examiner* — Hung Q Dang
(74) *Attorney, Agent, or Firm* — McDermott Will & Emery LLP

(57) ABSTRACT

A bus bar assembly including a bus bar including a coupling interface; an enclosure surrounding a portion of the bus bar, wherein the enclosure exposes the coupling interface; and a bracket including a first portion and a second portion, the first portion of the bracket coupling the enclosure to the bus bar with one or more fasteners, the second portion of the bracket coupled to an aggregate rail, wherein the coupling interface of the bus bar is coupled to a respective power supply of one or more servers that are removably coupled to the aggregate rail.

11 Claims, 9 Drawing Sheets

AGGREGATE RAIL SYSTEM FOR A RACK ASSEMBLY

BACKGROUND

Field of the Disclosure

The disclosure relates generally to an aggregate rail system for a rack assembly.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

Innovative aspects of the subject matter described in this specification may be embodied in a bus bar assembly including a bus bar including a coupling interface; an enclosure surrounding a portion of the bus bar, wherein the enclosure exposes the coupling interface; and a bracket including a first portion and a second portion, the first portion of the bracket coupling the enclosure to the bus bar with one or more fasteners, the second portion of the bracket coupled to an aggregate rail, wherein the coupling interface of the bus bar is coupled to a respective power supply of one or more servers that are removably coupled to the aggregate rail.

Other embodiments of these aspects include corresponding systems and apparatus.

These and other embodiments may each optionally include one or more of the following features. For instance, the second portion of the bracket includes one or more keyhole slots and the aggregate rail includes one or more posts, wherein when the second portion of the bracket is coupled to the aggregate rail, the posts of the aggregate rail are positioned within respective keyhole slots of the second portion of the bracket. Further including an additional bracket including a first portion and a second portion, the first portion of the additional bracket coupling the enclosure to the bus bar with one or more additional fasteners, the second portion of the additional bracket coupled to the aggregate rail at a second end of the enclosure, the second portion of the bracket coupled to the aggregate rail at a first end of the enclosure opposite to the second end of the enclosure.

Innovative aspects of the subject matter described in this specification may be embodied in an aggregate rail system, including: a first aggregate rail including first rails; a second aggregate rail including second rails, each second rail of the second rails corresponding to a respective first rail of the first rails; a bus bar including a coupling interface; an enclosure surrounding a portion of the bus bar, wherein the enclosure exposes the coupling interface; and a bracket including a first portion and a second portion, the first portion of the bracket coupling the enclosure to the bus bar with one or more fasteners, the second portion of the bracket coupled to a particular first rail of the first rails of the first aggregate rail, wherein the coupling interface of the bus bar is coupled to a respective power supply of one or more servers that are removably coupled between respective corresponding first and second rails.

Other embodiments of these aspects include corresponding systems and apparatus.

These and other embodiments may each optionally include one or more of the following features. For instance, further including a power shelf electrically coupled to the bus bar. Each of the first rails and the second rails are of substantially the same depth. Each of the first rails and the second rails includes respective posts. The second portion of the bracket includes one or more keyhole slots, wherein when the second portion of the bracket is coupled to the particular first rail, the posts of the particular first rail are positioned within respective keyhole slots of the second portion of the bracket. Further including an additional bracket including a first portion and a second portion, the first portion of the additional bracket coupling the enclosure to the bus bar with one or more additional fasteners, the second portion of the additional bracket coupled to a another first rail of the first rails of the first aggregate rail at a second end of the enclosure, the second portion of the bracket coupled to the particular first rail at a first end of the enclosure opposite to the second end of the enclosure.

Innovative aspects of the subject matter described in this specification may be embodied in a rack assembly, including a first aggregate rail system, including: a first pair of aggregate rails, the first pair of aggregate rails including first rails of a first depth; a first bus bar assembly, including a first bus bar coupled to at least one of the first rails of the first pair of aggregate rails, wherein the first bus bar is coupled to a respective power supply of one or more first servers that are removably coupled to the first aggregate rail system, a second aggregate rail system, including: a second pair of aggregate rails, the second pair of aggregate rails including second rails of a second depth, wherein the second depth differs from the first depth; and a second bus bar assembly, including a second bus bar coupled to at least one of the second rails of the second pair of aggregate rails, wherein the second bus bar is coupled to a respective power supply of one or more second servers that are removably coupled to the second aggregate rail system.

Other embodiments of these aspects include corresponding systems and apparatus.

These and other embodiments may each optionally include one or more of the following features. For instance, the first bus bar includes a first coupling interface that is coupled to the respective power supply of the one or more first servers that are removably coupled to the first aggregate rail system, and the second bus bar includes a second coupling interface that is coupled to the respective power supply of the one or more second servers that are removably coupled to the second aggregate rail system. The first bus bar assembly further includes a first enclosure surrounding a portion of the first bus bar, wherein the first enclosure exposes the first coupling interface, and the second bus bar assembly further includes a second enclosure surrounding a portion of the second bus bar, wherein the second enclosure exposes the second coupling interface. The first bus bar assembly further includes a first bracket including a first portion and a second portion, the first portion of the first bracket coupling the first enclosure to the first bus bar with one or more first fasteners, the second portion of the first bracket coupled to the one of the first rails of the first pair of aggregate rails, and the second bus bar assembly further includes a second bracket including a first portion and a second portion, the first portion of the second bracket coupling the second enclosure to the second bus bar with one or more second fasteners, the second portion of the second bracket coupled to the one of the second rails of the second pair of aggregate rails. Each of the first rails includes respective first posts, and each of the second rails includes respective second posts. The second portion of the first bracket includes one or more first keyhole slots, wherein when the second portion of the first bracket is coupled to the one of the first rails of the first pair of aggregate rails, the first posts of the one of the first rails of the first pair of aggregate rails are positioned within respective first keyhole slots of the second portion of the first bracket, and the second portion of the second bracket includes one or more second keyhole slots, wherein when the second portion of the second bracket is coupled to the one of the second rails of the second pair of aggregate rails, the second posts of the one of the second rails of the second pair of aggregate rails are positioned within respective second keyhole slots of the second portion of the second bracket. The first bus bar assembly further includes an additional first bracket including a first portion and a second portion, the first portion of the additional first bracket coupling the first enclosure to the first bus bar with one or more additional first fasteners, the second portion of the additional first bracket coupled to another first rail of the first pair of aggregate rails at a second end of the first enclosure, the second portion of the first bracket coupled to the one of the first rails of the first pair of aggregate rails at a first end of the first enclosure opposite to the second end of the first enclosure, and the second bus bar assembly further includes an additional second bracket including a first portion and a second portion, the first portion of the additional second bracket coupling the second enclosure to the second bus bar with one or more additional second fasteners, the second portion of the additional second bracket coupled to another second rail of the second pair of aggregate rails at a second end of the second enclosure, the second portion of the second bracket coupled to the one of the second rails of the second pair of aggregate rails at a first end of the second enclosure opposite to the second end of the second enclosure. The first aggregate rail system further includes a first power shelf electrically coupled to the first bus bar and the second bus bar.

Particular implementations of the subject matter described in this specification can be implemented so as to realize one or more of the following advantages. For example, mounting a power bus bar to an aggregate rail system can reduce tolerance loops.

The details of one or more embodiments of the subject matter described in this specification are set forth in the accompanying drawings and the description below. Other potential features, aspects, and advantages of the subject matter will become apparent from the description, the drawings, and the claims.

Figure 1:
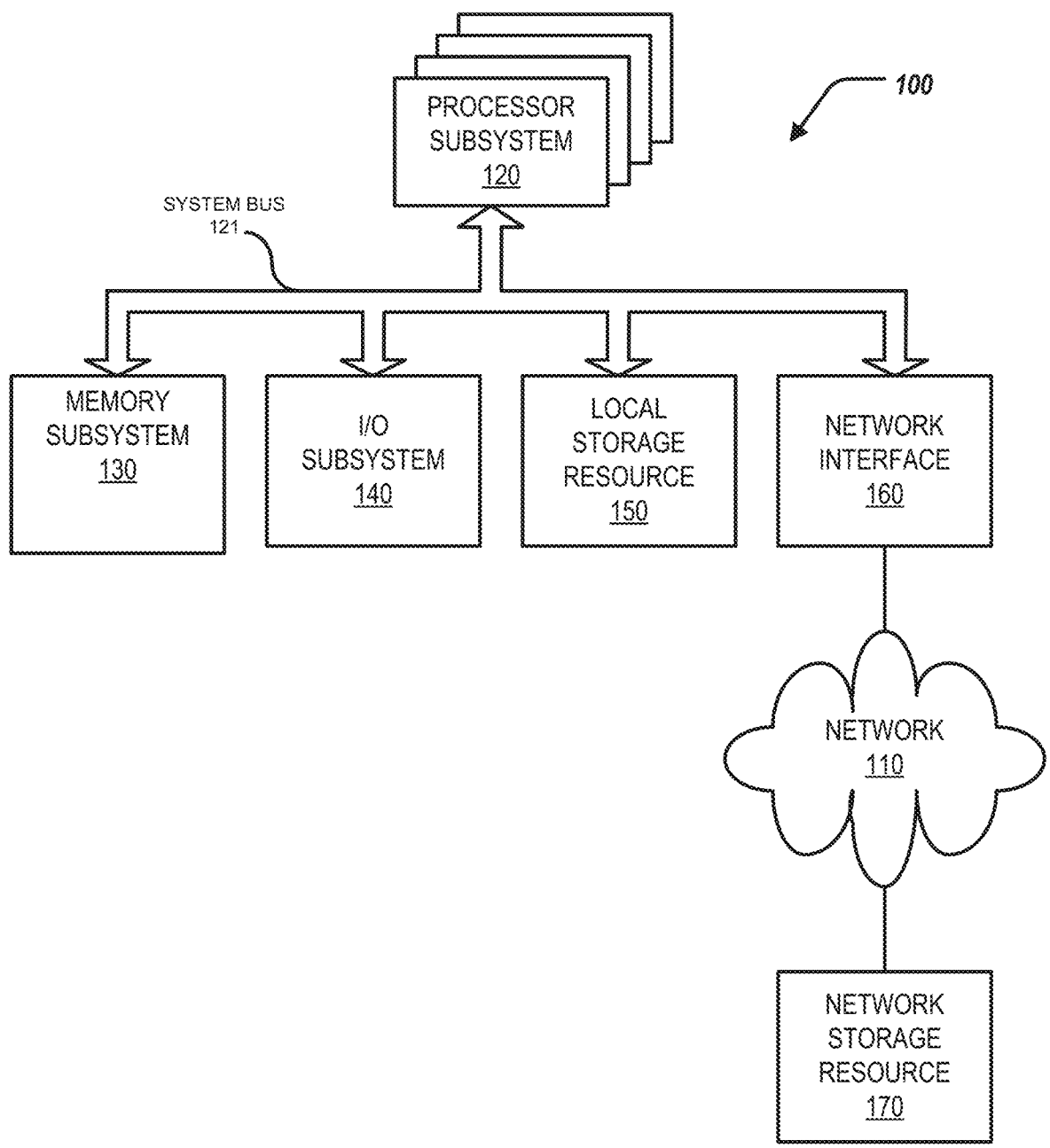
FIG. 1 is a block diagram of selected elements of an embodiment of an information handling system.

DESCRIPTION OF PARTICULAR
EMBODIMENT(S)

This disclosure discusses methods and systems for an aggregate rail system for a rack assembly. In short, multiple servers can be included in a server rack assembly. A bus bar can be coupled to one or more of the servers to provide power to the servers. The servers can have differing depths, and multiple bus bars can be coupled to each grouping of servers of each depth.

Specifically, this disclosure discusses a bus bar assembly including a bus bar including a coupling interface; an enclosure surrounding a portion of the bus bar, wherein the enclosure exposes the coupling interface; and a bracket including a first portion and a second portion, the first portion of the bracket coupling the enclosure to the bus bar with one or more fasteners, the second portion of the bracket coupled to an aggregate rail, wherein the coupling interface of the bus bar is coupled to a respective power supply of one or more servers that are removably coupled to the aggregate rail.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-7 wherein like numbers are used to indicate like and corresponding parts.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

In short, the information handling system 100 can be included in a server rack assembly, along with multiple other information handling systems 100 (or servers). A bus bar can be coupled to one or more of the servers to provide power to the servers. The servers can have differing depths, and multiple bus bars can be coupled to each grouping of servers of each depth.

Figure 2:
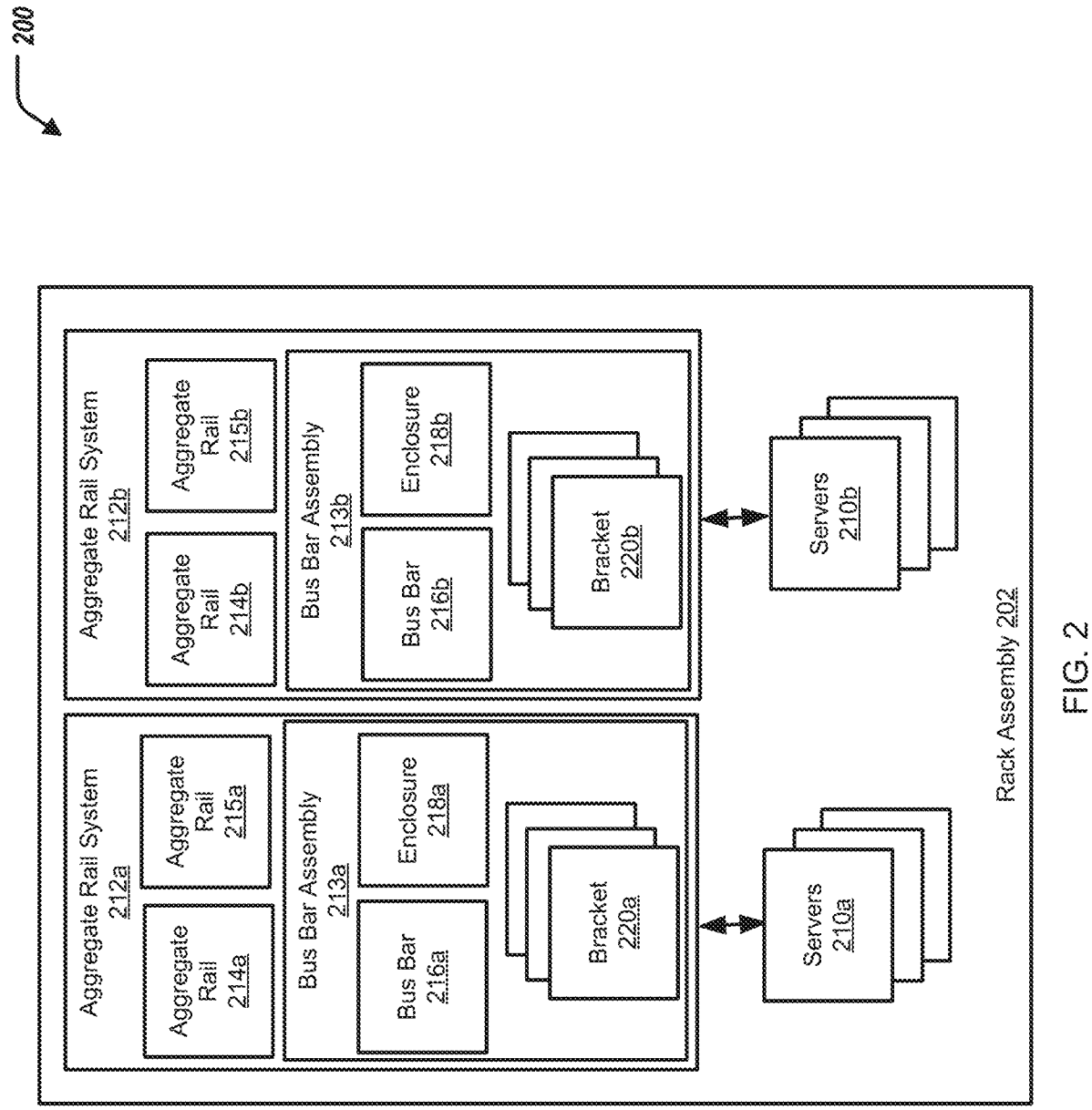
FIG. 2 illustrates a block diagram of a server rack assembly.

Turning to FIG. 2, FIG. 2 illustrates an environment 200 including a rack assembly 202. The rack assembly 202 can include one or more first servers 210a, one or more second servers 210b, a first aggregate rail system 212a, and a second aggregate rail system 212b. The first aggregate rail system 212a can include a first aggregate rail 214a, a second aggregate rail 215a, and a first bus bar assembly 213a. The first bus bar assembly 213a can include a first bus bar 216a, a first enclosure 218a, and one or more brackets 220a. The second aggregate rail system 212a can include a first aggregate rail 214b, a second aggregate rail 215b, and a second bus bar assembly 213b. The second bus bar assembly 213b can include a second bus bar 216b, a second enclosure 218b, and one or more brackets 220b.

The servers 210a, 210b can collectively be referred to as servers 210. The aggregate rail systems 212a, 212b can be collectively referred to as aggregate rail systems 212. The first aggregate rails 214a, 214b can be collectively referred to as first aggregate rails 214. The second aggregate rails 215a, 215b can be collectively referred to as second aggregate rails 215. The first bus bar 216a and the second bus bar 216b can be collectively referred to as bus bars 216. The first enclosure 218a and the second enclosure 218b can be collectively referred to as enclosures 218. The brackets 220a, 220b can be collectively referred to as brackets 220.

In some examples, the server 210 is similar to, or includes, the information handling system 100 of FIG. 1.

Figure 3:
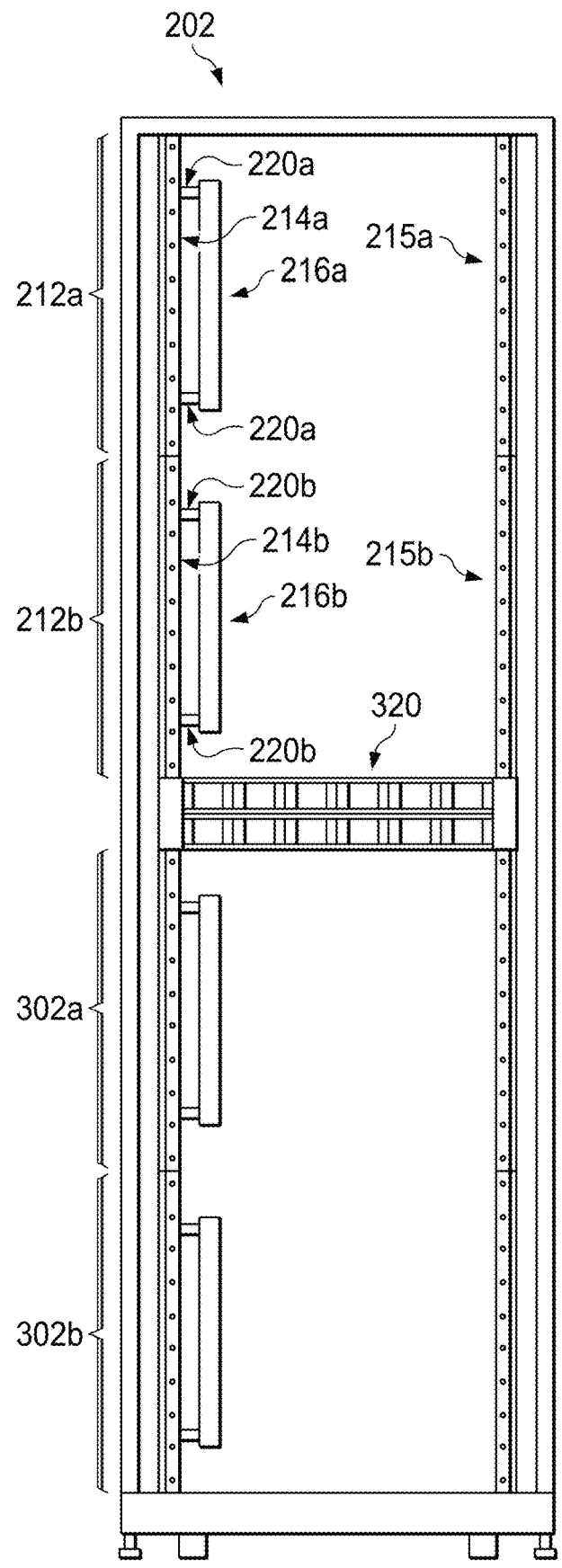
FIG. 3 is a front view of the rack assembly.

FIG. 3 illustrates a front view of an example rack assembly 202. The rack assembly 202 can include the first aggregate rail system 212a and the second aggregate rail system 212b. Furthermore, as illustrated, the rack assembly 202 can include any number of aggregate rail systems, including aggregate rail systems 302a, 302b that are both substantially the same as the aggregate rail system 212.

The first aggregate rail system 212a includes a pair of aggregate rails—the first aggregate rail 214a and the second aggregate rail 215a. The first bus bar 216a can be coupled to the first aggregate rail 214a via the brackets 220a. The second aggregate rail system 212b includes a pair of aggregate rails—the first aggregate rail 214b and the second aggregate rail 215b. The second bus bar 216b can be coupled to the first aggregate rail 214b via the brackets 220b.

The server rack 202 and/or the second aggregate rail system 212b can include a power shelf 320. The power shelf 320 can be electrically coupled to the second bus bar 216b and/or the first bus bar 216a (e.g., via daisy-chain (not shown)). The server rack 202 can include any number of power shelves.

Figure 4:
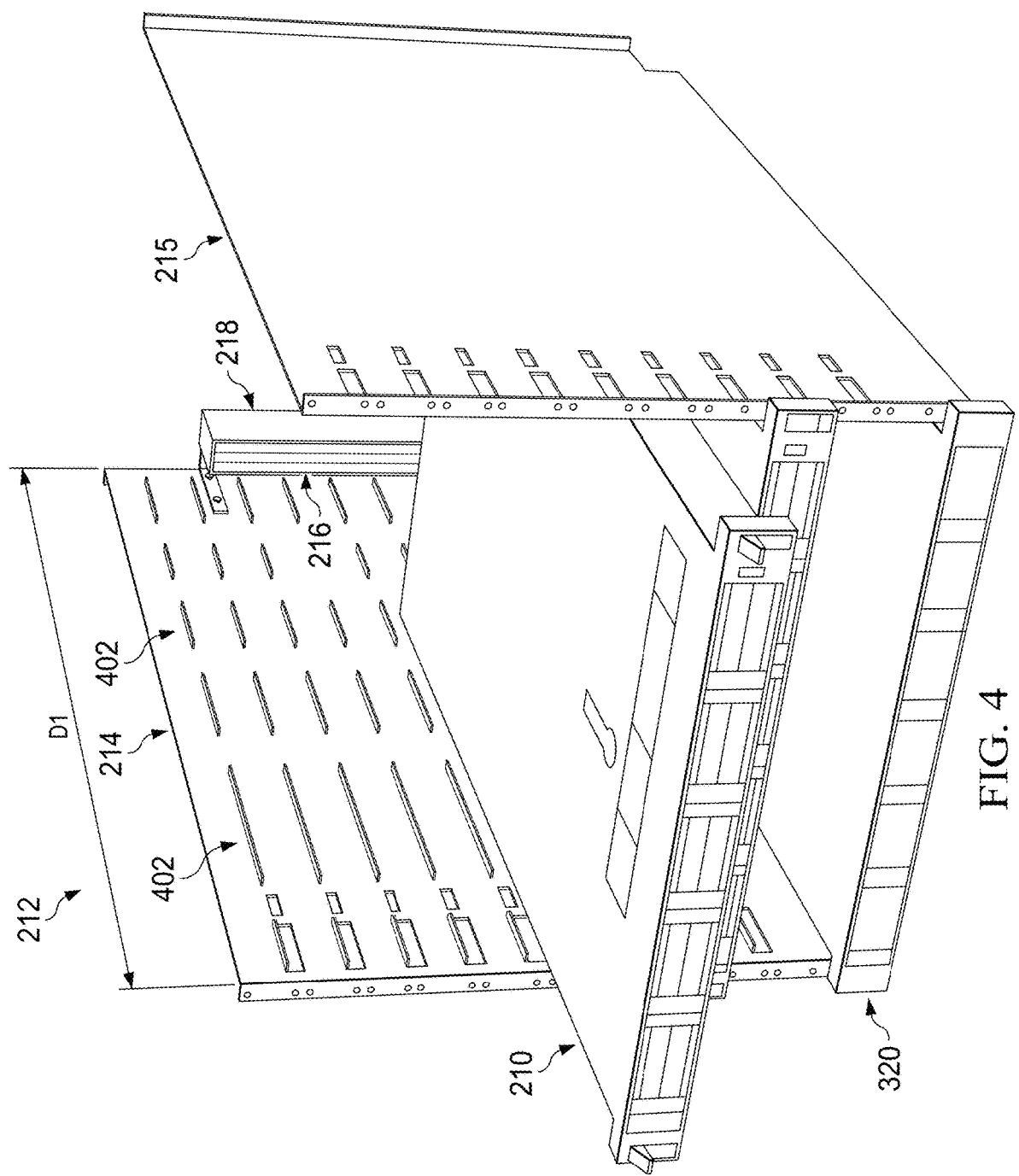
FIG. 4 is a perspective view of an aggregate rail system of the rack assembly.

FIG. 4 illustrates a perspective front view of one of the aggregate rail systems 212. The first aggregate rail 214 can include first rails 402. The second aggregate rail 215 can include second rails 404 (shown on FIG. 6B). Each second rail 404 can correspond to a respective first rail 402. Each of the first rails 402 and each of the second rails 404 can be of substantially the same depth, shown as D1.

Figure 5A:
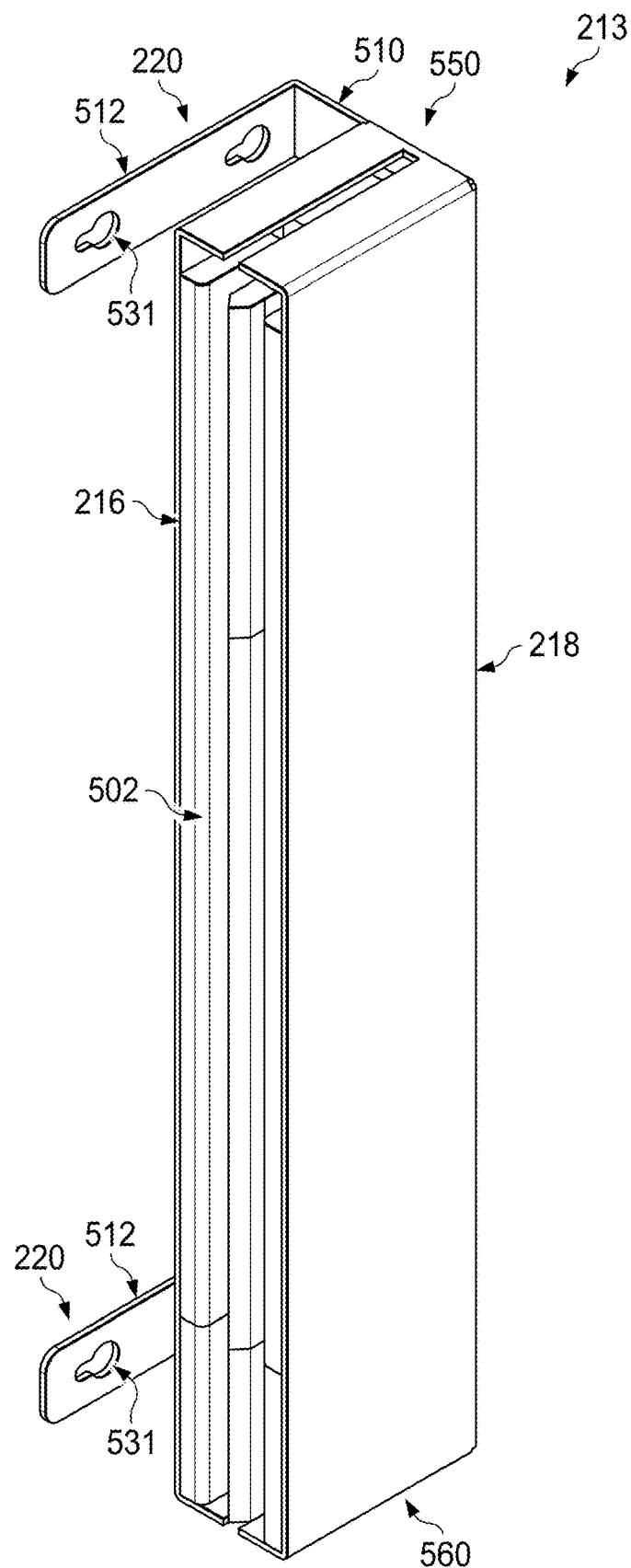
FIG. 5A is a perspective front view of a bus bar assembly of the aggregate rail system.
Figure 5B:
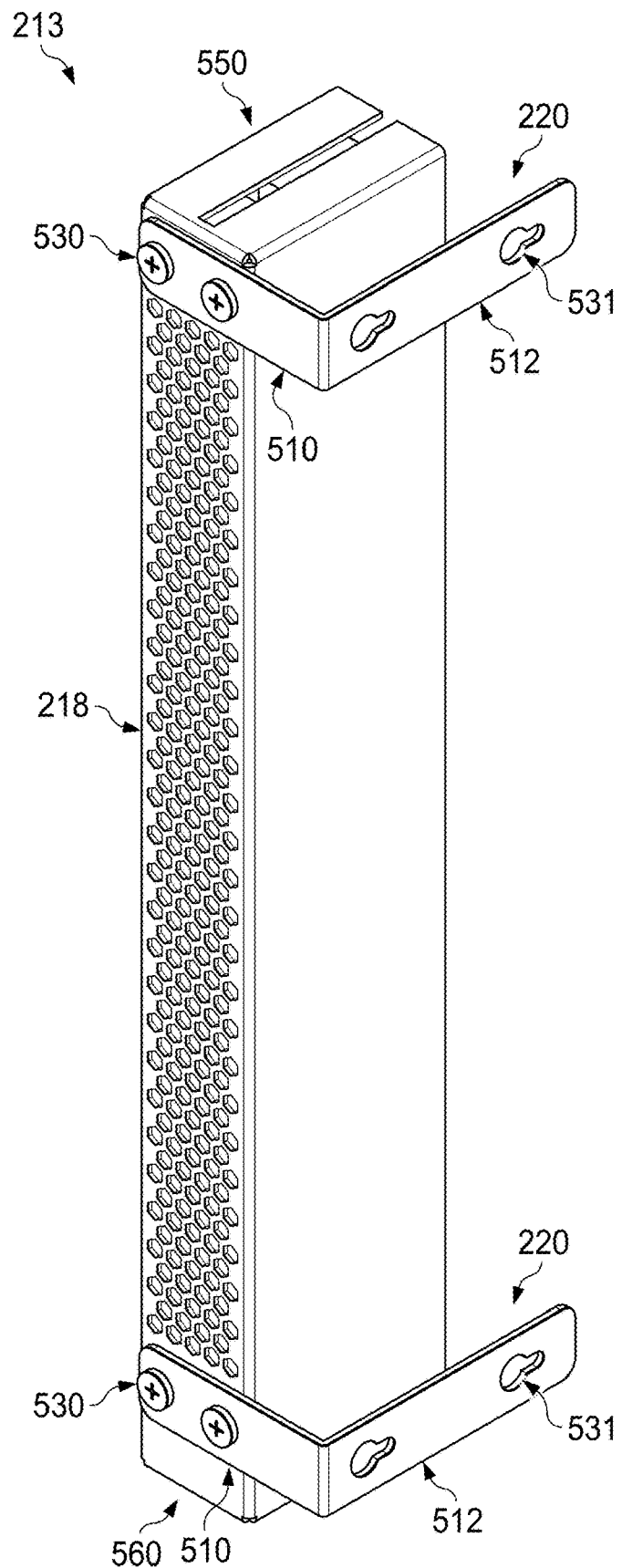
FIG. 5B is a perspective back view of a bus bar assembly of the aggregate rail system.

The bus bar 216 can at least partially be surrounded by the enclosure 218 (also shown in FIGS. 5A, 5B). The bus bar 216 can be coupled to the first aggregate rail 214 by brackets 220, and in particular, the enclosure 218 can be coupled to the first aggregate rail 214 by one or more fasteners (e.g., screws). The enclosure 218 can formed from sheet metal. The brackets 220 can be formed from sheet metal.

The server 210 can be coupled between respective corresponding first rails 402 and second rails 404. As illustrated, only one server 210 is coupled between corresponding first rails 402 and second rails 404; however, any number of servers 210 can be coupled between corresponding first rails 402 and second rails 404 based on the number of corresponding rails 402, 404. For example, the aggregate rail system 212 can include 8 or 10 corresponding sets of first rails 402 and second rails 404.

Figure 6A:
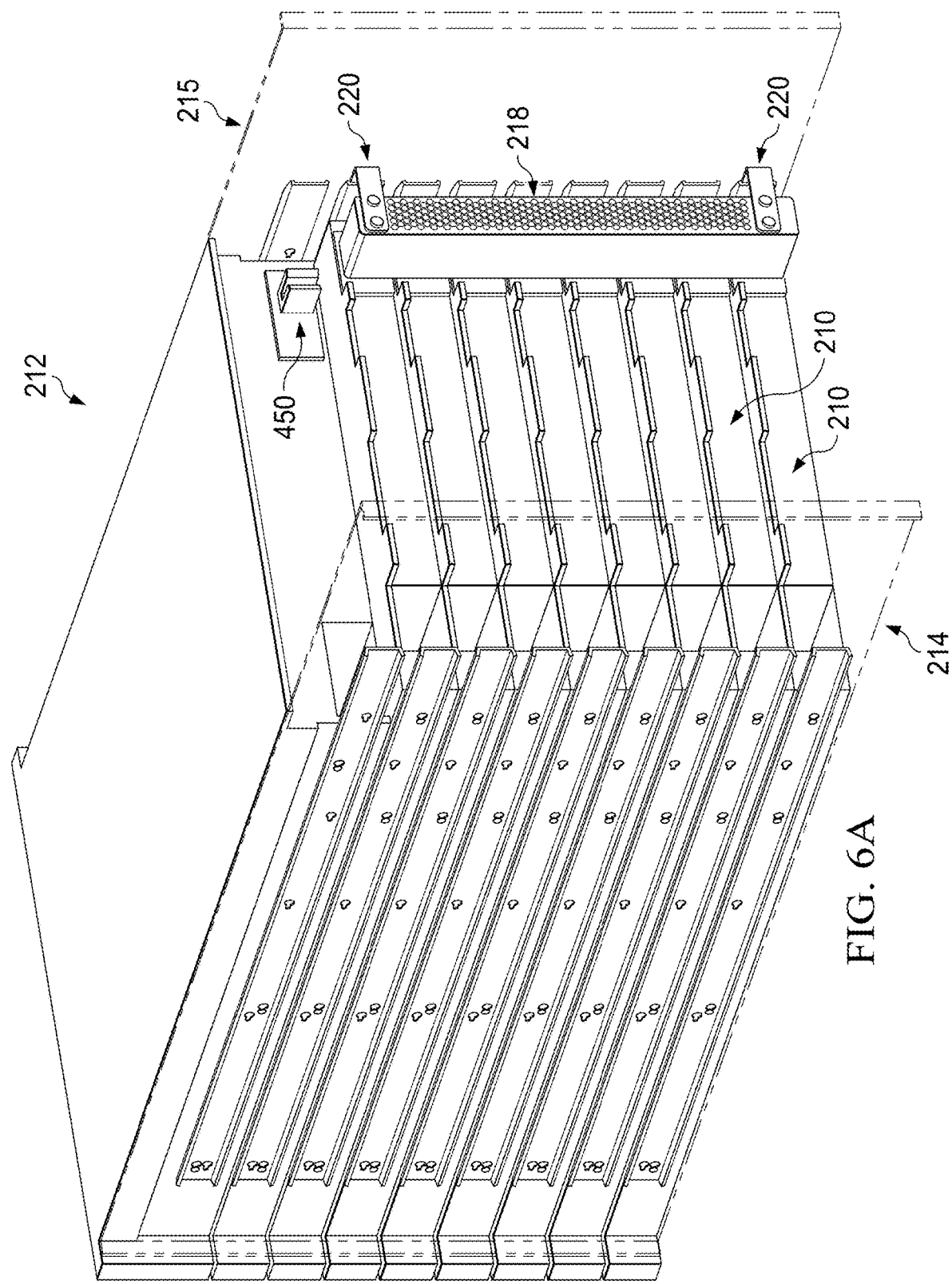
FIG. 6A is a perspective back view of the aggregate rail system.
Figure 7:
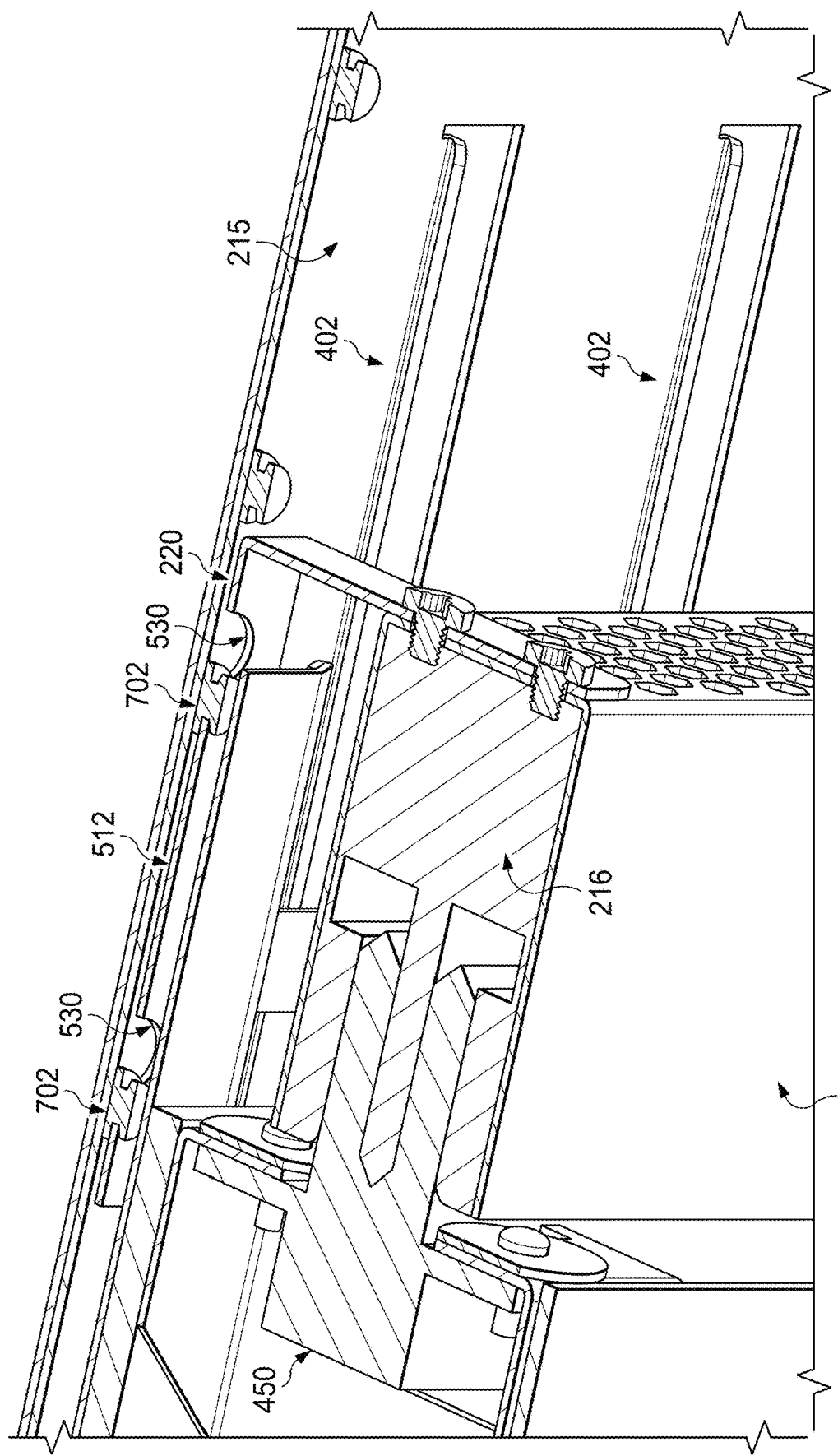
FIG. 7 is a cutaway top down perspective view of the aggregate rail system

Each of the servers 210 can include one or more power supplies 450, shown in FIGS. 6A and 7. To that end, the bus bar 216 can be coupled to respective power supplies 450 of the servers 210, described further herein.

To that end, for each aggregate rail system 212, the depth of the servers 210 coupled to that aggregate rail system 212 and the depth of the first rails 402, second rails 404 of the aggregate rail system 212 are substantially the same. However, for the first aggregate rail system 212a, the depth of the first servers 210a coupled to the first aggregate rail system 212a and the depth of the rails of the first aggregate rail system 212a can differ from, for the second aggregate rail system 212b, the depth of the second servers 210b coupled to the second aggregate rail system 212b and the depth of the rails of the second aggregate rail system 212b.

FIG. 5A illustrates a front view of the bus bar assembly 213; and FIG. 5B illustrates a back view of the bus bar assembly 213. The bus bar 216 can include a coupling interface 502. The enclosure 218 can surround a portion of the bus bar 216, including exposing the coupling interface 502. The coupling interface 502 can be coupled to respective power supplies 450 of the servers 210 shown in FIGS. 6A and 7, described further herein.

The bracket 220 can include a first portion 510 and a second portion 512. The first portion 510 of the bracket 220 couples the enclosure 218 to the bus bar 216 with fasteners 530. The second portion 512 of the bracket 220 includes keyhole slots 531. The second portion 452 of the bracket 220 couples the enclosure 218, and the bus bar 216, to the first rails 402 of the first aggregate rail 214, shown in FIGS. 3 and 4.

In some examples, one of the brackets 220 is coupled to the enclosure 218 and the bus bar 216 at a first end 550 of the first enclosure 218; and another of the brackets 220 is coupled to the enclosure 218 and the bus bar 216 at a second end 560 of the enclosure 218 opposite to the first end 560.

Figure 6B:
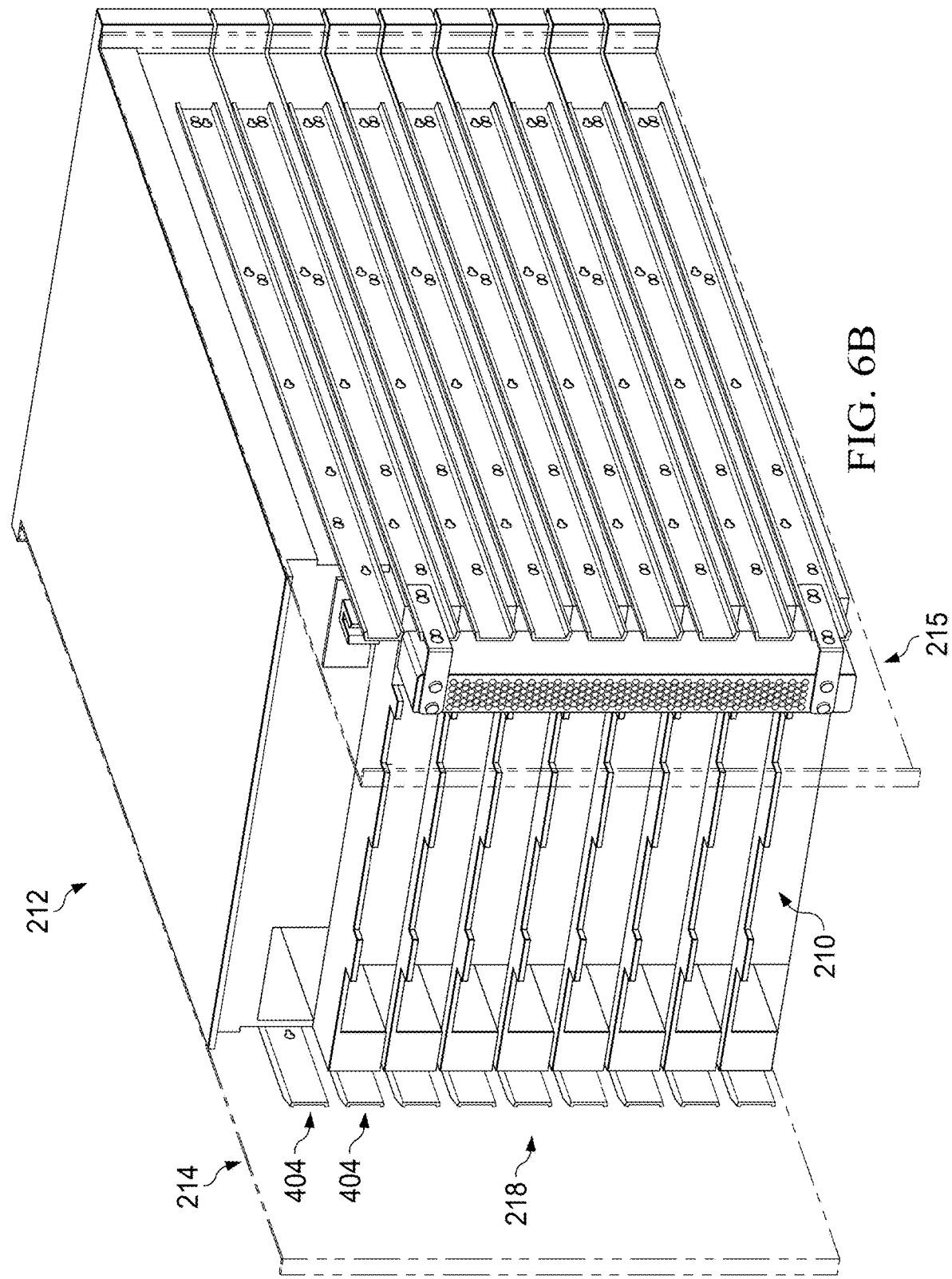
FIG. 6B is a perspective back view of the aggregate rail system.

FIGS. 6A, 6B illustrate perspective back views of the aggregate rail system 212. The bus bar 216 is coupled to respective power supplies 450 of the servers 210. Specifically, the coupling interface 502 of the bus bar 216, shown in FIGS. 5A, 5B, is coupled with respective power supplies 450 (or interface elements of the power supplies 450) of the servers 210.

FIG. 7 illustrates a cutaway top down view of the aggregate rails system 212. Each of the rails 402 can include posts 702. To that end, the posts 702 of the rail 402 are positioned within respective keyhole slots 531 of the second portion 512 of the bracket 220 to couple the second portion 512 of the bracket 220 to the rail 402.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A rack assembly, including:
a first server having a first depth;
a second server having a second depth differing from the first depth;
a power shelf;
a first aggregate rail system, including:
a first aggregate rail including first rails of the first depth;
a second aggregate rail including second rails of the first depth, each second rail of the second rails corresponding to a respective first rail of the first rails;
a first bus bar including a coupling interface;
a first enclosure surrounding a portion of the first bus bar, wherein the first enclosure exposes the coupling interface of the first bus bar; and
a first bracket including a first portion and a second portion, the first portion of the first bracket coupling the first enclosure to the first bus bar with one or more fasteners, the second portion of the first bracket coupled to a particular first rail of the first rails of the first aggregate rail,
wherein the coupling interface of the first bus bar is coupled to a respective power supply of one or more first servers that are removably coupled between respective corresponding first and second rails, and coupled to the power shelf;
a second aggregate rail system, including:
a third aggregate rail including third rails of the second depth;
a fourth aggregate rail including fourth rails of the second depth, each fourth rail of the fourth rails corresponding to a respective third rail of the third rails;
a second bus bar including a coupling interface;
a second enclosure surrounding a portion of the second bus bar, wherein the second enclosure exposes the coupling interface of the second bus bar; and
a second bracket including a third portion and a fourth portion, the third portion of the second bracket coupling the second enclosure to the second bus bar with one or more fasteners, the fourth portion of the second bracket coupled to a particular third rail of the third rails of the second aggregate rail,
wherein the coupling interface of the second bus bar is coupled to a respective power supply of one or more second servers that are removably coupled between respective corresponding first and second rails, and coupled to the power shelf through a daisy-chain connection with the first bus bar.

2. The rack assembly of claim 1, wherein each of the first rails and the second rails includes respective posts.

3. The rack assembly of claim 2, wherein the second portion of the bracket includes one or more keyhole slots, wherein when the second portion of the bracket is coupled to the particular first rail, the posts of the particular first rail are positioned within respective keyhole slots of the second portion of the bracket.

4. The rack assembly of claim 3, further including an additional bracket including a first portion and a second portion, the first portion of the additional bracket coupling the enclosure to the bus bar with one or more additional fasteners, the second portion of the additional bracket coupled to a another first rail of the first rails of the first aggregate rail at a second end of the enclosure, the second portion of the bracket coupled to the particular first rail at a first end of the enclosure opposite to the second end of the enclosure.

5. A rack assembly, including:
a first server having a first depth;
a second server having a second depth differing from the first depth;

a power shelf;
a first aggregate rail system, including:
  a first pair of aggregate rails, the first pair of aggregate rails including first rails of the first depth;
  a first bus bar assembly, including a first bus bar coupled to at least one of the first rails of the first pair of aggregate rails,
  wherein the first bus bar is coupled to a respective power supply of one or more first servers that are removably coupled to the first aggregate rail system, and coupled to the power shelf;
a second aggregate rail system, including:
  a second pair of aggregate rails, the second pair of aggregate rails including second rails of the second depth; and
  a second bus bar assembly, including a second bus bar coupled to at least one of the second rails of the second pair of aggregate rails,
  wherein the second bus bar is coupled to a respective power supply of one or more second servers that are removably coupled to the second aggregate rail system, and coupled to the power shelf through a daisy-chain connection with the first bus bar.

6. The rack assembly of claim 5, wherein
the first bus bar includes a first coupling interface that is coupled to the respective power supply of the one or more first servers that are removably coupled to the first aggregate rail system, and
the second bus bar includes a second coupling interface that is coupled to the respective power supply of the one or more second servers that are removably coupled to the second aggregate rail system.

7. The rack assembly of claim 6, wherein
the first bus bar assembly further includes a first enclosure surrounding a portion of the first bus bar, wherein the first enclosure exposes the first coupling interface, and
the second bus bar assembly further includes a second enclosure surrounding a portion of the second bus bar, wherein the second enclosure exposes the second coupling interface.

8. The rack assembly of claim 7, wherein
the first bus bar assembly further includes a first bracket including a first portion and a second portion, the first portion of the first bracket coupling the first enclosure to the first bus bar with one or more first fasteners, the second portion of the first bracket coupled to the one of the first rails of the first pair of aggregate rails, and
the second bus bar assembly further includes a second bracket including a first portion and a second portion, the first portion of the second bracket coupling the second enclosure to the second bus bar with one or more second fasteners, the second portion of the second bracket coupled to the one of the second rails of the second pair of aggregate rails.

9. The rack assembly of claim 8, wherein
each of the first rails includes respective first posts, and
each of the second rails includes respective second posts.

10. The rack assembly of claim 9, wherein
the second portion of the first bracket includes one or more first keyhole slots, wherein when the second portion of the first bracket is coupled to the one of the first rails of the first pair of aggregate rails, the first posts of the one of the first rails of the first pair of aggregate rails are positioned within respective first keyhole slots of the second portion of the first bracket, and
the second portion of the second bracket includes one or more second keyhole slots, wherein when the second portion of the second bracket is coupled to the one of the second rails of the second pair of aggregate rails, the second posts of the one of the second rails of the second pair of aggregate rails are positioned within respective second keyhole slots of the second portion of the second bracket.

11. The rack assembly of claim 10, wherein
the first bus bar assembly further includes an additional first bracket including a first portion and a second portion, the first portion of the additional first bracket coupling the first enclosure to the first bus bar with one or more additional first fasteners, the second portion of the additional first bracket coupled to another first rail of the first pair of aggregate rails at a second end of the first enclosure, the second portion of the first bracket coupled to the one of the first rails of the first pair of aggregate rails at a first end of the first enclosure opposite to the second end of the first enclosure, and
the second bus bar assembly further includes an additional second bracket including a first portion and a second portion, the first portion of the additional second bracket coupling the second enclosure to the second bus bar with one or more additional second fasteners, the second portion of the additional second bracket coupled to another second rail of the second pair of aggregate rails at a second end of the second enclosure, the second portion of the second bracket coupled to the one of the second rails of the second pair of aggregate rails at a first end of the second enclosure opposite to the second end of the second enclosure.

* * * * *